United States Patent [19]

Machado et al.

[11] Patent Number: 5,041,016

[45] Date of Patent: Aug. 20, 1991

[54] FLEXIBLE LINK CONNECTOR

[75] Inventors: Edward J. Machado, Lowell; Pamela J. Adams, Andover; Donald A. Grassi, Bedford; Thomas G. Tirone, Billerica, all of Mass.

[73] Assignee: Raytheon Company, Lexington, Mass.

[21] Appl. No.: 490,804

[22] Filed: Mar. 8, 1990

[51] Int. Cl.⁵ .............................................. H01R 43/00
[52] U.S. Cl. ...................................... 439/502; 29/827
[58] Field of Search ................... 439/67, 77, 492, 493, 439/876, 502, 507; 357/70; 29/827, 876–884; 361/400–408

[56] References Cited

U.S. PATENT DOCUMENTS 4,531,285  7/1985  Lucas .................................... 29/827
4,769,908  9/1988  Olsson ................................... 29/884

Primary Examiner—Neil Abrams
Attorney, Agent, or Firm—Donald F. Mofford; Richard M. Sharkansky

[57] ABSTRACT

A connector for interconnecting circuitry on a ceramic substrate card with circuitry on a printed wiring board for use in a missile includes a plurality of wire leads, each one of the leads having a first end and a second end, is described. The connector also includes a first dielectric strip attached adjacent the first end of the loop of each one of the plurality of wire leads and a second dielectric strip attached adjacent the second end of the loop of each one of the plurality of wire leads. Stresses on each one of the plurality of wire leads resulting from different rates of movement between the interconnected circuitry are minimized, thus preventing the wire leads from fracturing.

17 Claims, 2 Drawing Sheets

FLEXIBLE LINK CONNECTOR

This invention was made with Government support under Contract No. F08635-87-C-0065 awarded by the Air Force. The Government has certain rights in this invention.

BACKGROUND OF THE INVENTION

This invention relates generally to connectors and more particularly to a flexible link connector to interconnect a ceramic substrate card with a printed wiring board.

As it is known in the art, it is often necessary to interconnect circuitry on a ceramic substrate card with circuitry on a printed wiring board to facilitate construction of an electronic assembly. A known connector to accomplish this includes a plurality of wire leads disposed between a pair of flexible dielectric substrates. This connector is generally known as a "flex-print" connector. Flex-print, also referred to as flexible printed wiring, includes a sheet of dielectric material to space and support the plurality of wire leads (also known as conductors) disposed thereon. Typically a flexprint also has a second sheet of dielectric material over the exposed surface of the plurality of wire leads providing, when necessary, a cover coat to protect the plurality of wire leads.

When used to interconnect a ceramic substrate card with a printed wiring board, a first end of each one of the plurality of wire leads is attached, typically by soldering, to a bonding pad disposed on a surface of the ceramic substrate card providing an interface between the pad and the connector, and the second end of the conductor is attached to a pad, which is connected to the circuitry on the printed wiring board. The connector is provided with U-shaped leads so that when the leads are attached to the pads on the ceramic substrate card and the pads on the printed wiring board a service loop is provided which will allow for different rates of movement between the ceramic substrate card and the printed wiring board. Additionally, the U-shaped leads allow for different rates of expansion between the ceramic substrate card and the printed wiring board.

A second known connector used to interconnect circuitry on a ceramic substrate card with circuitry on a printed wiring board includes a plurality of wire leads with each lead having a plurality of bends, with each one of the plurality of wire leads being attached to a dielectric strip. Thus, when interconnecting a ceramic substrate card and a printed wiring board, each one of the wire leads of the second known connector has a first end attached to a pad on a surface of the ceramic substrate card having a first bend at a first external angle of 135 degrees with respect to the surface of the ceramic substrate card so that a first section of the wire lead is extending from the surface of the substrate card at an internal angle of 45 degrees. A second end of each one of the wire leads is attached to a pad on a surface of the printed wiring board with a second bend at an external angle of 135 degrees so that a second section of the wire lead is extending from the surface of the printed wiring board at an internal angle of 45 degrees. A center bend is provided at an internal angle of 90 degrees so that the first section of the wire lead extending from the ceramic substrate card will continue and match the second section of the wire lead extending from the printed wiring board. A pair of opposing dielectric strips are attached to each one of the plurality of wire leads between the second bend and the center bend of each wire lead to maintain the spacing between each one of the plurality of wire leads.

When the electronic assembly utilizing the printed wiring board and the ceramic substrate cards are used in a missile, the electronic assembly is subject to excessive forces and stresses not typically encountered. A missile carried on a fighter aircraft, for example, is subjected to long periods of vibration and changes in temperature while the fighter aircraft is in flight. The above-mentioned known connectors used in the missile often have a problem with fracturing due to metal fatigue on the wire lead at a point above the interface between the wire lead and the pad on the ceramic substrate card or the printed wiring board. Additionally, the wire lead during periods of vibration produces stress on the pad on the surface of the ceramic substrate card or the printed wiring board causing the pad to lift off of the surface. Another problem exists in that during the process of soldering the wire lead to a pad, solder will flow up the lead so that the agility of the wire lead is reduced, thus increasing the possibility of the pad lifting from the substrate or the wire lead fracturing. Additionally, the solder joint formed during the process of soldering will fracture during periods of high vibrations.

It is also known in the art that an acrylic conformal coating is often used to cover solder joints and wire leads not covered by a dielectric material to protect the solder joints and the wire leads from the environment. A problem with applying a conformal coating over the solder joint of the flex-print is the conformal coating is typically also applied to the U-shaped loop reducing the agility of the wire lead. This increases the stress placed on the wire leads, the solder joints, and the pads on the surface of the ceramic substrate card and the printed wiring board during periods of vibration or thermal expansion.

It is also know in the art, when fabricating a plurality of ceramic substrate cards or printed wiring boards with pads located on the surface of each one of the plurality, a tolerance in the location of each one of the pads must be allowed in locating each pad on the respective surface. Subsequently, depending upon the location of each one of the pads, it may be necessary to flex the connector so that the respective end of each one of the plurality of wire leads mate with a pad. The latter increases the stress placed on each one of the pads.

SUMMARY OF THE INVENTION

In accordance with the present invention, a connector for interconnecting circuitry includes a plurality of wire leads, each one of the leads having a first end, a second end and a center loop having a first end and a second end. The connector further includes a first dielectric strip attached adjacent the first end of the loop of each one of the plurality of wire leads and a second dielectric strip attached adjacent the second end of the loop of each one of the plurality of wire leads. With such an arrangement, stresses on each one of the plurality of wire leads resulting from different rates of movement between the interconnected circuitry are minimized, thus preventing the wire leads from fracturing.

In accordance with a further aspect of the present invention, a connector for interconnecting circuitry on a ceramic substrate card with circuitry on a printed wiring board includes a plurality of wire leads, each one of the plurality of wire leads including a center loop, disposed approximately at the center of the wire lead, having an arc with a radius approximately 13 to 17 times the thickness of the wire lead and extending for approximately three-eighths of a circle. A first center shank is disposed adjacent the center loop, extending toward a first end of the wire lead and having a length approximately 27 times the thickness and a second center shank is disposed adjacent the center loop, extending toward a second end of the wire lead and having a length approximately 30 times the thickness. A first end loop is disposed adjacent the first center shank, having an arc with a radius approximately 5 to 8 times the thickness and extending for one-quarter of a circle, the arc of the first end loop opposing the arc of the center loop, and a second end loop is disposed adjacent the second center shank, having an arc with a radius approximately 5 to 8 times the thickness and extending for one-eighth of a circle, the arc of the second end loop opposing the arc of the center loop. A first end shank is disposed adjacent the first end loop, extending to the first end and a second end shank is disposed adjacent the second end loop, extending to the second end. Each one of the plurality of wire leads is attached to a first pair of dielectric strips at the first center shank, substantially adjacent the first end loop of the wire lead, and a second pair of dielectric strips at the second center shank, substantially adjacent the second end loop of the wire lead. With such an arrangement, damage done to a solder joint provided by either the first or the second end shank of each one of the wire leads when soldered to a pad on the ceramic substrate card or the printed wiring board is minimized as well as, damage to each one of the wire leads due to the relative motion between the printed wiring board and the ceramic substrate card. Additionally, the first and second pair of dielectric strips are disposed such that solder is impeded from flowing up the center loop while each lead is being soldered.

In accordance with a further aspect of the present invention, a method of interconnecting circuitry disposed on a ceramic substrate card with circuitry disposed on a printed wiring board for use in a missile is provided. A plurality of wire leads, each one of the plurality having a thickness, a width and a length with a first end, a second end and a center is provided. A first pair of strips of dielectric material is attached to each one of the plurality between the first end and the center and a second pair of strips of dielectric material is attached to each one of the plurality between the second end and the center. Each one of the plurality of wire leads is bent approximately at the center until a center loop with an arc is provided with a radius approximately 13 to 17 times the thickness. The center loop extends for approximately three-eighths of a circle. Each one of the plurality of wire leads is further bent between the first end and the first pair of strips of dielectric material until a first loop with an arc is provided with a radius approximately 5 to 8 times the thickness. The first loop extends for one-quarter of a circle and opposes the center loop. Each one of the plurality of wire leads is bent again between the second end and the second pair of strips of dielectric material until a second loop with an arc is provided with a radius approximately 5 to 8 times the thickness. The second loop extends for one-eighth of a circle and opposes the center loop. The first end of each one of the plurality of wire leads is attached to a pad connected to the circuitry disposed on the printed wiring board and the second end of each one of the plurality of wire leads is attached to a pad connected to the circuitry disposed on the ceramic substrate card. By ensuring the distance between the edge of the pad on the printed wiring board closest to the ceramic substrate card and a point in the same plane as the pad on the printed wiring board diametrically opposed the edge of the pad on ceramic substrate card closest to the edge of the ceramic substrate card is less than the distance between the edge of the first loop and a point on the same plane of the pad on the printed wiring board diametrically opposed the edge of the second loop, the possibility of the pad on either the ceramic substrate card or the printed wiring board lifting is reduced. The corners of the ceramic substrate card are bonded to the printed wiring board further reducing the relative motion between the ceramic substrate card and the printed wiring board. With this particular technique, the stress on the plurality of wire leads is reduced thus reducing the possibility of fracturing when used in a missile and the plurality of wire leads are less apt to lift the pads from the printed wiring board and the ceramic substrate card.

BRIEF DESCRIPTION OF THE DRAWINGS

For a more complete understanding of this invention, reference is now made to the following description of the accompanying drawings, wherein.

DESCRIPTION OF THE PREFERRED EMBODIMENTS

Figure 1:
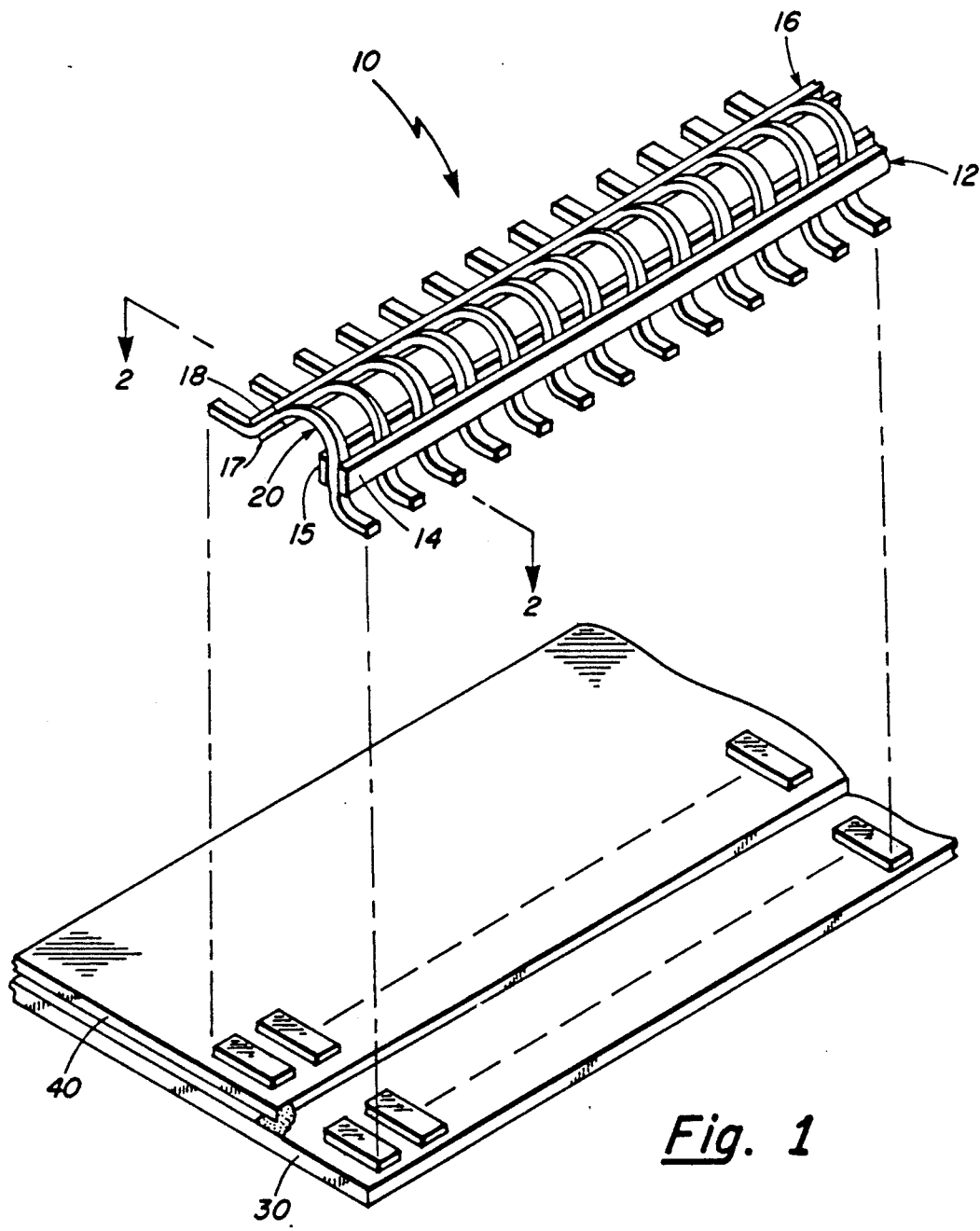
FIG. 1 is an isometric view, partially exploded, of a connector according to this invention interconnected with a ceramic substrate card and a printed wiring board before solder is applied.

Referring now to FIG. 1, it may be seen that a flexible link connector 10 (hereinafter referred to as connector 10) according to this invention includes a plurality of wire leads (not numbered), typified by wire lead 20. Connector 10 includes a first pair 12 of dielectric strips, including dielectric strip 14 and dielectric strip 15 and a second pair 16 of dielectric strips, including dielectric strip 17 and dielectric strip 18 which are large enough to have enough strength to maintain the spacing between each one of the plurality of wire leads, while small enough to reduce the stress transferred from one wire lead to another wire lead when the connector 10 is subject to periods of vibration or thermal expansion. As to be described in more detail hereinafter, pair 12 and pair 16 are also strategically attached to each one of the plurality of wire leads to control the flow of solder when each wire lead is soldered to a respective pad on a ceramic substrate card 40 or a printed wiring board 30.

Figure 2:
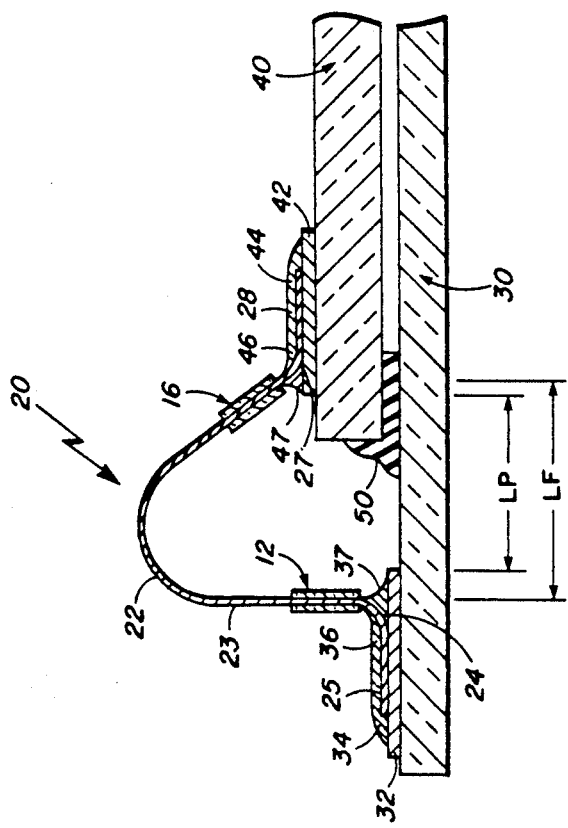
FIG. 2 is a cross-sectional view of a single wire lead according to the invention soldered to a pad on a ceramic substrate card and a pad on a printed wiring board.

Referring now to FIG. 2, a printed wiring board 30 including circuitry (not shown) disposed on a dielectric slab (not numbered) may be used in all types of applications including electronic assemblies (not shown) in a missile. The circuitry (not shown) on the printed wiring board 30 includes a first plurality of pads (not shown), as typified by pad 32 disposed on the printed wiring board 30. Additionally, a plurality of ceramic substrate cards, as typified by ceramic substrate card 40, is disposed on the printed wiring board 30 facilitating construction of the electronic components (not shown). Circuitry (not shown) on the ceramic substrate card 40 includes a second plurality of pads, as typified by pad 42 disposed on ceramic substrate card 40 Pad 32 and pad 42 (as are all of the first and second plurality of pads) are used to facilitate interconnecting the circuitry (not shown) on the printed wiring board 30 with the circuitry (not shown) on the ceramic substrate card 40. Here the ceramic substrate card 40 is attached to the printed wiring board 30 by bonding the four corners and various points of the ceramic substrate card to the printed wiring board 30 using a polysulfide adhesive 50.

When printed wiring board 30 is used in a missile (not shown), the printed wiring board 30 and ceramic substrate card 40 are subjected to stresses, such as, excessive thermal expansion and excessive vibration not typically encountered in a benign environment. Typically, the printed wiring board 30 will have a rate of thermal expansion and a rate of vibration which differ from those of the ceramic substrate card 40. To accommodate these different rates of thermal expansion and vibration, connector 10 (FIG. 1), is used to interconnect the circuitry (not shown) on the printed wiring board 30 with the circuitry (not shown) on the ceramic substrate card 40. Each one of the plurality of wire leads of connector 10, as typified by wire lead 20, is attached to a respective pad on the printed wiring board 30 and a respective pad on the ceramic substrate card 40. Since wire lead 20 is typical of each one of the plurality of wire leads, only a detailed description of wire lead 20 is given, but is applicable to each one of the plurality of wire leads. Wire lead 20, as will be described, minimizes damage done to solder joint 36 and solder joint 46, as well as, damage done to itself due to the relative motion between the printed wiring board 30 and the ceramic substrate card 40.

Figure 4:
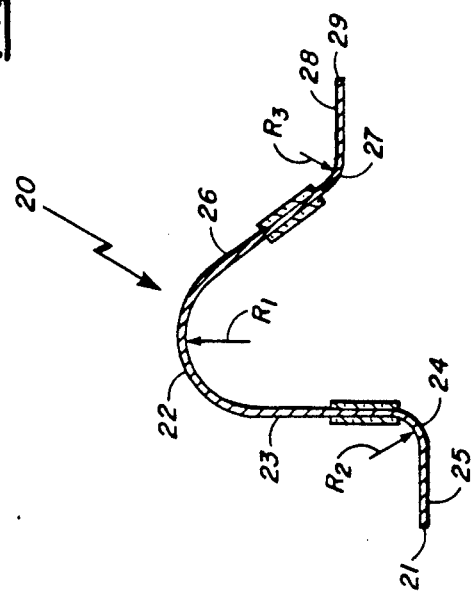
FIG. 4 is a plan view of a single wire lead according to the invention.

Referring now to FIG. 4, a preferred arrangement for wire lead 20 includes a center loop 22 disposed approximately at the center of the wire lead 20, having an arc with a radius, $R_1$, here approximately 13 to 17 times the thickness of the wire lead 20 and here extending for approximately three-eighths of a circle. A first center shank 23 is disposed adjacent the center loop 22, the first center shank 23 having a length approximately 27 times the thickness of the wire lead 20 and extending toward a first end 21 of the wire lead 20. A first end loop 24 is disposed adjacent the first center shank 23, the first end loop 24 having an arc with a radius, $R_2$, here approximately 5 to 8 times the thickness and here extending for one-quarter of a circle. The arc of the first end loop 24 is opposing the arc of the center loop 22. A first end shank 25, here having a length 30 to 40 times the thickness of the wire lead 20 is disposed adjacent the first end loop 24 and extends toward the first end 21.

A second center shank 26 is disposed adjacent the center loop 22 of wire lead 20, the second center shank 26 here has a length approximately 30 times the thickness and extending toward a second end 29 of wire lead 20. A second end loop 27 is disposed adjacent the second center shank 26, the second end loop 27 having an arc with a radius, $R_3$, here approximately 5 to 8 times the thickness of the wire lead 20 and extending for one-eighth of a circle. The arc of the second end loop 27 opposes the arc of the center loop 22. A second end shank 28, here having a length 30 to 40 times the thickness of the wire lead 20, is disposed adjacent the second end loop 27 and extends toward the second end 29. In a preferred embodiment, the thickness of the wire lead 20 is 0.003 inches so that the corresponding dimensions of wire lead 20 may be calculated.

Referring again to FIG. 2, it will be observed that first end shank 25 is attached to pad 32 of printed wiring board 30 by providing a solder joint 36 using solder fillet 34. The second end shank 28 is attached to pad 42 of ceramic substrate card 40 by providing a solder joint 46 using solder fillet 44. It should be appreciated by one of skill in the art that loading on the wire lead 20 so that the wire lead 20 is stressed will occur when a preload is applied to the wire lead 20 if the wire lead 20 is flexed when the wire lead 20 is soldered to pad 32 and pad 34. Wire lead 20 is also stressed if displacement of the ceramic substrate card 40 relative to the printed wiring board 30 occurs.

It has been found that by increasing the radius of the center loop 22 the maximum stress and vibration is reduced. When using one-half hard beryllium copper in wire lead 20, the maximum stress on the wire lead 20 is a linear function of the thickness of the wire lead 20, so by decreasing the wire thickness, the stress on the wire load 20 is decreased. For example, decreasing the thickness from 0.005 inches to 0.003 inches reduces the stress to 60 percent of the original level.

Stress on the wire lead 20 is also a linear function of the relative displacement of the ceramic substrate card 40 with the printed wiring board 30 when using one-half hard beryllium copper in wire lead 20, so steps should be taken to reduce the relative displacement. By bonding the corners of the ceramic substrate card 40 to the printed wiring board 30, the relative displacement at the corners is decreased and therefore the stress is decreased. Additionally, keeping the size of the radius of first end loop 24 and the radius of second end loop 27 four to eight times longer than the thickness of wire lead 20 minimizes the stress placed on wire lead 20, so that metal fatigue due to stress is minimized.

It should be appreciated that loading on the pad 42 will occur when the wire lead 20 is interacting with pad 42. It has been found that for a linear analysis the maximum stress on the pad 42 occurs at the heel 47 of solder joint 46 and the load on the pad 42 varies with the cube of the thickness of the wire lead 20. Therefore, reducing the thickness of the wire lead 20 from 0.005 inches to 0.003 inches reduces the load on the pad 42 to 21.6 percent of an original load. Also by increasing the size of the center loop 22, the load on pad 42 is decreased. The loading on pad 42, as described herein, is also applicable to the loading on pad 32.

Since the maximum stress on pad 42 occurs at the heel 47 of solder joint 46, the placement of the heel 47 should be controlled to ensure the heel 47 is not at an edge of the pad 42. The latter ensures that the wire lead 20 is pulling on the pad 42 instead of potentially peeling the pad 42 at the edge, since the peel strength of the pad 42 is much lower than the shear strength of the pad 42. By ensuring that part of the solder fillet 44 is formed behind the heel of the pad 42, the survivability of the pad 42 is increased.

In the preferred embodiment, wire lead 20 is comprised of one-half hard beryllium copper with a layer of copper and a layer of tin-lead eutectic disposed thereon. Since beryllium copper forms a tenacious oxide which is difficult to remove with most mild fluxes used for typical soldering applications, a poor bond is often formed between the beryllium copper and the solder.

By disposing a layer of copper and a layer of tin-lead eutectic over the one-half hard beryllium copper, the problem of oxide formation is reduced and a strong solder joint is ensured. One-half hard veryllium copper has been found to be preferred, providing a superior resistance to fatigue as compared, for example, annealed veryllium copper as OxygenFree High Conductivity (OFHC) copper, so that the possibility of wire lead 20 fracturing is reduced.

Each one of the plurality of wire leads, as typified by wire lead 20, is attached (here by bonding) to the first pair 12 of dielectric strips and the second pair 16 of dielectric strips, as shown. Pair 12 and pair 16 are disposed on wire lead 20 so that when wire lead 20 is placed on pad 32 and pad 42 and soldered, the height of solder fillet 34 and solder fillet 44 as provided on pad 32 and pad 42, respectively, is controlled by pair 12 and pair 16, respectively. By controlling the height of the solder fillet 34 and the solder fillet 44, rejection due to workmanship standards on solder fillet height is reduced. Additionally, pair 12 and pair 16 of dielectric strips prevent solder from flowing up the wire lead 20 during the soldering process. If solder was to flow up the wire lead 20, the solder on the wire lead 20 would reduce the agility of the wire lead 20 and increase the possibility of the wire lead 20 fracturing. Also, if a conformal coating (not shown) is applied to protect the solder joint 36 and the solder joint 46, the pair 12 and pair 16, respectively, help to prevent the conformal coating (not shown) from flowing up the wire lead 20 and reducing the agility of the wire lead 20. Pair 12 and pair 16 provide an open space between each one of the plurality of wire leads making possible the use of an automated hot-gas solder reflow assembly technique, so that direct heating of the wire lead is possible and the passage of hot gas (typically nitrogen) to reflow the pad 32 and pad 42, as well as all of the pads on the printed wiring board 30 and the ceramic substrate card 40. In the preferred embodiment, the pair 12 and the pair 16 of dielectric strips are comprised of a polymide film known as Kapton, which is a registered trademark of E. I. DuPont de Nemours & Co., Inc.

Figure 3:
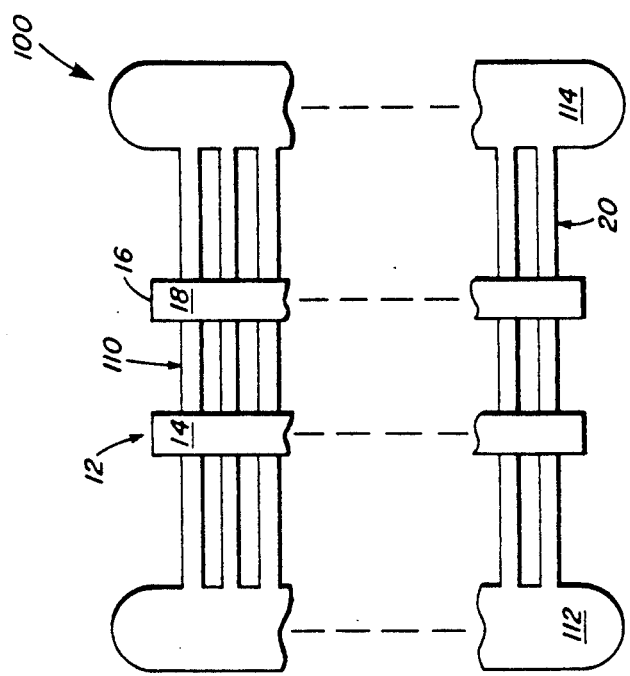
FIG. 3 is a plan view of a connector before being shaped and having excess material removed.

Referring now to FIG. 3, a sheet 100 of one-half hard beryllium copper was etched, by known techniques, to provide a plurality 110 of wire leads as typified by wire lead 20. The plurality 110 of wire leads are plated with a layer of copper and then plated with a layer of tin-lead eutectic. The pair 12 of dielectric strips including dielectric strip 14 and dielectric strip 15 (FIG. 1) is bonded to each one of the plurality 110 of wire leads as shown. Additionally, the pair 16 of dielectric strips including dielectric strip 17 (FIG. 1) and dielectric strip 18 is bonded to each one of the plurality 110 of wire leads as shown. Pair 12 and pair 16 are bonded to each one of the plurality 110 of wire leads at dimensions so that when shaped each one of the plurality 110 of wire leads have the dimension as described hereinbefore. The center loop 22 (FIG. 4) is formed on each one of the plurality 110 of wire leads with a radius $R_1$ (FIG. 4). Subsequently, the first end loop 24 (FIG. 4) with a radius $R_2$ (FIG. 4) and the second end loop 27 (FIG. 4) with a radius $R_3$ (FIG. 4) are each formed on each one of the plurality 110 of wire leads having the dimensions as described hereinbefore. Finally, any excess of the the sheet 100 attached to each one of the plurality 110 of wire leads is cut away, as necessary. Tab 112 and tab 114 are used to maintain the spacing between each one of the plurality 110 of wire leads until the pair 12 and the pair 16 of dielectric strips are bonded to each one of the plurality 110, but tab 112 and tab 114 are disposed of when the excess of the sheet 100 is cut away from the plurality 110 of wire leads. The number of the plurality 110 of wire leads can be any number, but should be at least as many as required for the longest connectors.

Referring again to FIGS. 1 & 2, it can be seen that connector 10 may be provided as a single part with the number of wire leads being equal to the number of the largest requirement, thus reducing the number of separate items needed to be stocked. If a connector 10 is required with the number of wire leads being less than that which is provided, a technician can easily cut the pair 12 and the pair 16 of dielectric strips, as necessary, to match the number of wire leads in connector 10 to the requirement of an interconnection.

As described hereinbefore, the placement of the heel 47 should be controlled to ensure the heel 47 is not at an edge of the pad 42. By controlling the assembly tolerances of the printed wiring board 30 and the ceramic substrate card 40 and controlling the dimensions of each one of the plurality of wire leads, stress on each one of the pads can be minimized. Letting the distance between the edge of pad 32 and a point on the plane of pad 32 diametrically opposed the edge of pad 42 equal a distance LP and the distance between the edge of loop 24 and a point on the plane of pad 32 diametrically opposed the edge of loop 27 equal a distance LF, it should be appreciated that in all instances during assembly the distance LF should be greater than the distance LP, thus ensuring the heel 37 and the heel 47 do not approach the edge of pad 32 or pad 42, respectively. Additionally, the edge of the ceramic substrate card 40 should not extend beyond approximately the center of the center loop 22 so that the center loop 22 is not impeded from acting as a proper service loop with its agility reduced. This also ensures a space between the vertical edge of the ceramic substrate card 40 and the first center shank 23. In the preferred embodiment, the space should be 0.010 inches minimum.

Having described a preferred embodiment of the invention, it will now become apparent to one of skill in the art that other embodiments incorporating the concepts may be used. It is felt, therefore, that these embodiments should not be limited to the disclosed embodiment, but rather should be limited only by the spirit and scope of the appending claims.

What is claimed is:

1. A connector used in a missile for interconnecting circuitry disposed on a ceramic card with circuitry disposed on a printed wiring board comprising:
   (a) a plurality of wire leads, each one having a first end, a second end and a center loop having a first end and a second end;
   (b) a first dielectric strip attached adjacent the first end of the loop of each one of the wire leads; and
   (c) a second dielectric strip attached adjacent the second end of the loop of each one of the wire leads; and
   (d) wherein the center loop of each one of the plurality of wire leads is disposed approximately at the center, having an arc with a radius approximately 13 to 17 times the thickness and extending for approximately three-eights of a circle and wherein each one of the plurality of wire leads having a thickness, a width and a length further comprises:
      (i) a first center shank, disposed adjacent the center loop extending toward the first end and having a length approximately 27 times the thickness and a second center shank, disposed adjacent the center loop, extending toward the second end and having a length approximately 30 times the thickness;

(ii) a first end loop, disposed adjacent the first center shank, having an arc with a radius approximately 5 to 8 times the thickness and extending for approximately one-quarter of a circle, the arc of the first end loop, disposed adjacent the second center shank, having an arc with a radius approximately 5 to 8 times the thickness and extending for approximately one-eighth of a circle, the arc of the second end loop opposing the arc of the center loop; and (iii) a first end shank, disposed adjacent the first end bend, extending to the first loop and a second end shank, disposed adjacent the second end loop, extending to the second end.

2. A connector as in claim 1 wherein a third dielectric strip is provided with the first dielectric strip to provide a first pair of dielectric strips attached to each one of the plurality of wire leads at the first center shank substantially adjacent the first end loop and a fourth dielectric strip is provided with the second dielectric strip to provide a second pair of dielectric strips attached to each one of the plurality of wire leads at the second center shank substantially adjacent the second end loop.

3. A connector as in claim 2, wherein each one of the plurality of conductive strips is comprised of one-half hard beryllium copper.

4. A connector as in claim 3, wherein each one of the plurality of conductive strips further comprises a copper coating and a tin-lead coating disposed over each one of the plurality.

5. A connector, as in claim 4, wherein the thickness is approximately 0.003 inches, the radius of the arc of the center loop is approximately 0.040 inches, and the radius of the arc of the first end loop and the radius of the arc of the second end loop are approximately 0.015 inches.

6. A method of interconnecting circuitry disposed on a ceramic card with circuitry disposed on a printed wiring board for use in a missile, the method comprising the steps of:

(a) providing a plurality of wire leads, each one of the plurality of wire leads having a thickness, a width and a length with a first end, a second end and a center;

(b) attaching a first pair of strips of dielectric material to each one of the plurality of wire leads between the first end and the center of each one of the plurality of wire leads and a second pair of strips of dielectric material to each one of the plurality of wire leads between the second end and the center of each one of the plurality of wire leads;

(c) bending each one of the plurality of wire leads at approximately the center until a center loop with an arc is provided with a radius approximately 13 to 17 times the thickness of each one of the plurality of wire leads, the center loop extending for approximately three-eighths of a circle;

(d) bending each one of the plurality of wire leads between the first end and the first pair of strips of dielectric material until a first loop with an arc is provided with a radius approximately 5 to 8 times the thickness, the first loop extending for one-quarter of a circle and opposing the center loop;

(e) bending each one of the plurality of wire leads between the second end and the second pair of strips of dielectric material until a second loop with an arc is provided with a radius approximately 5 to 8 times the thickness, the second loop extending for one-eighth of a circle and opposing the center loop; and (f) attaching the first end of each one of the plurality of wire leads to a pad connected to the circuitry disposed on the printed wiring board and the second end of each one of the plurality of wire leads to a pad connected to the circuitry disposed on the ceramic card.

7. The method of claim 6 further comprising the steps of:

(a) bonding the corners of the ceramic substrate card to the printed wiring board; and (b) ensuring that no foreign material is disposed on the center loop of each one of plurality of wire leads.

8. The method of claim 7 further comprising the step of coating each one of the plurality of wire leads with a layer of copper and a layer of tin-lead eutectic.

9. The method of claim 8, wherein each one of the plurality of wire leads is comprised of half-hard beryllium copper and the dielectric material is comprised of Kapton.

10. The method of claim 9, wherein the thickness of each one of the plurality of wire leads is 0.003 inches.

11. The method of claim 10, wherein the radius of the arc which is provided by bending each one of the plurality of wire leads at approximately the center is approximately 0.040 inches.

12. The method of claim 7 further comprising the step of ensuring the first loop does not extend beyond an edge of the pad on the printed wiring board and ensuring the second loop does not extend beyond an edge of the pad on the ceramic substrate card.

13. The method of claim 12 further comprising the step of ensuring there is a space between an edge of the ceramic substrate card and each one of the wire leads on the printed wiring board.

14. A connector used in a missile for interconnecting circuitry disposed on a ceramic card with circuitry disposed on a printed wiring board, the connector comprising:

(a) a plurality of wire leads, each one of the plurality having a thickness of approximately 0.003 inches, a width between approximately 0.014 inches and 0.022 inches and a length with a first end, a second end and a center, each one of the plurality comprising:

(i) a center loop, disposed approximately at the center, having an arc with a radius between approximately 0.040 inches and 0.050 inches and extending for substantially three-eighths of a circle;

(ii) a first center shank, disposed adjacent the center loop, extending toward the first end and having a length approximately 0.080 inches and a second center shank, disposed adjacent the center loop, extending toward the second end and having a length approximately 0.090 inches;

(iii) a first end loop, disposed adjacent the first center shank, having an arc with a radius between approximately 0.015 inches and 0.025 inches and extending for substantially one-quarter of a circle, the arc of the first end loop opposing the arc of the center loop, and a second end loop, disposed adjacent the second center shank, having an arc with a radius between approximately 0.015 inches and 0.025 inches and extending for substantially one-eighth of a circle, the arc of the second end loop opposing the arc of the center loop; and (iv) a first end shank, disposed adjacent the first end loop, extending to the first end and a second end shank, disposed adjacent the second end loop, extending to the second end; and (b) a first pair of dielectric strips attached to each one of the plurality of wire leads at the first center shank substantially adjacent the first end loop and a second pair of dielectric strips attached to each one of the plurality of wire leads at the second center shank substantially adjacent the second end loop.

15. A connector, as in claim 14, wherein each one of the plurality of conductive strips is comprised of one-half hard beryllium copper.

16. A connector, as in claim 15, wherein each one of the plurality of conductive strips further comprises a layer of copper and a layer of tin-lead eutectic disposed over each one of the plurality.

17. A connector, as in claim 16, wherein each one of the dielectric strips is comprised of Kapton.

* * * * *